United States Patent
Yoshino

[11] Patent Number: 6,111,309
[45] Date of Patent: Aug. 29, 2000

[54] SEMICONDUCTOR DEVICE

[75] Inventor: Daiki Yoshino, Yokohama, Japan

[73] Assignee: Kabushiki Kaisha Toshiba, Kanagawa-Ken, Japan

[21] Appl. No.: 09/322,741

[22] Filed: May 28, 1999

[30] Foreign Application Priority Data

May 29, 1998 [JP] Japan ................................. 10-149511

[51] Int. Cl.$^7$ ................................. H01L 23/02
[52] U.S. Cl. ..................... 257/678; 257/678; 257/687; 257/737; 257/779; 257/780; 257/786
[58] Field of Search .................... 257/687, 737, 257/779, 780, 786, 678

[56] References Cited

U.S. PATENT DOCUMENTS

| | | | |
|---|---|---|---|
| 5,550,408 | 8/1996 | Kunitomo et al. | 257/37 |
| 5,670,826 | 9/1997 | Bessho et al. | 257/737 |
| 5,869,886 | 2/1999 | Tokuno | 257/678 |
| 5,874,784 | 2/1999 | Aoki et al. | 257/48 |
| 5,894,167 | 4/1999 | Moden et al. | 257/679 |

FOREIGN PATENT DOCUMENTS

| | | | |
|---|---|---|---|
| 364020631 | 1/1989 | Japan | 257/687 |
| 403108363 | 5/1991 | Japan | 257/687 |
| 405021638 | 1/1993 | Japan | 257/687 |

OTHER PUBLICATIONS

"Neutralization of Open Base Leakage", H.H. Nick, vol. 11 No. 10, Mar. 1969.

*Primary Examiner*—David Hardy
*Assistant Examiner*—Edgardo Ortiz
*Attorney, Agent, or Firm*—Hogan & Hartson, LLP

[57] ABSTRACT

A semiconductor device has a semiconductor chip including an external pad, a first substrate supporting the semiconductor chip on the first side, recesses arranged in matrix form on the second side, solder plugs filled in the recesses, and interconnections that connect the pads of the semiconductor chip to the solder plugs, being sealed by a molded resin body, and a second substrate provided with a solder paste on the first side. Recesses are made on the second side of the first substrate in matrix form and solder plugs are filled in the recesses as electrode pads for mounting. In the surface of the solder plugs trenches are made to form a lattice in plane view. The aspect ratio of the trench is large enough so that the molten solder paste is transferred deep into the recesses before the solder plugs are melted in mounting process.

13 Claims, 6 Drawing Sheets

SEMICONDUCTOR DEVICE

BACKGROUND OF THE INVENTION

1. Field of the Invention

The present invention relates to a semiconductor device, and more particularly, to a Chip Size Package (CSP) whose mounting area is similar to that of a semiconductor chip contained therein.

2. Description of the Prior Art

For semiconductor devices, integration thereof has been increased higher and higher, down-sizing and increasing number of pins have been strongly demanded. For this purpose, surface mount packaging technology in which pins are arranged in a two-dimensional array has been developed. As one of such surface mount packaging technology, BGA (Ball Grid Array) packaging is widely used because of a low cost packaging and good electrical characteristics such as low capacity and inductance. This is a method in which solder balls are arranged in matrix form on the backside of a substrate of a package having mounting area similar to that of a semiconductor chip.

An example of the prior art BGA packaging is described referring to FIG. 1, which shows a printed circuit board 60 having a BGA package thereon.

As shown in FIG. 1, a printed circuit board 60 has a semiconductor device package 50 and a printed interconnection board 40. The semiconductor device package 50 has a semiconductor chip 1 mounted in approximately center on a principal surface of a substrate 58 made of e.g. ceramic. Lead interconnections (not shown) formed on the principal surface of the substrate 58 are connected to external electrode pads arranged on the semiconductor chip 1 through bonding wires 2. The substrate 58 and the semiconductor chip 1 are both sealed for their surfaces so that they are protected from physical and chemical effects in external environments. Solder balls 54, as mounting pads, are arranged in matrix form on the back surface of the substrate 58. The solder balls 54 are connected to the external electrode pads of the semiconductor chip 1 through internal interconnection formed in internal layer of the substrate 58, the lead interconnection on the principal surface of the substrate 58 and bonding wire 2.

A printed interconnection board 40 has a multiple layer structure in which metal interconnections are provided on the principal surface and inner layers thereof. Solder paste 46 is printed on the part where the metal interconnections are to be connected to the solder balls 54 of the semiconductor device package 50.

The printed circuit board 60 is fabricated by placing the printed interconnection board 40 beneath the solder balls 54 of the semiconductor device package 50 and fusing the solder balls 54 using a reflow-process so that the semiconductor device package 50 is connected to the printed interconnection board 40.

The printed circuit board shown in FIG. 1 can thus be fabricated by soldering a semiconductor device package having mounting area similar to that of the chip size, directly to the printed interconnection board, resulting in good electrical characteristics of low capacity and inductance as described above and is widely used as a low cost, small and thin printed circuit board.

In recent years, however, demands for downsizing and decreasing thickness in semiconductor mounting are much more increased. Especially, in the field of computer apparatus, as increasing the need for mobile computers, the demand for reducing the volume, particularly thickness in mounting of semiconductor devices becomes stronger.

As for the conventional printed circuit board 60 shown in FIG. 1, decreasing the occupying area has been sufficiently achieved by employing the CSP structure. By employing FIG. 1, it is explained that the total thickness Tall are the sum of Ta (the thickness of the printed board 5), Tb (the thickness of the solder paste 46), Tc (the thickness of the solder balls 54), Td (the thickness of the substrate 58), Te (the thickness of the semiconductor chip 1), and Tf (the thickness of the resin 3 provided on the top of semiconductor chip 1).

Since the thickness Te of the semiconductor chip 1, and the thickness Ta, Td of substrates 5, 58 respectively are thinned up close to the ultimate limit, it is very difficult to decrease volume for mounting using the conventional structure, consequently it is required to modify the structure of printed circuits.

SUMMARY OF THE INVENTION

An object of the present invention is to provide a semiconductor device whose thickness in mounting can be reduced.

Another object of the present invention is to provide a semiconductor device wherein more reliable electrode connection between a semiconductor device package and a printed interconnection board is achieved.

According to the first aspect of the invention, there is provided; a semiconductor device including; a semiconductor chip having external pads, a substrate having a first side and a second side, for supporting the semiconductor chip on the first side, the substrate having; a plurality of recesses arranged in matrix form on the second side, a plurality of solder plugs filled in the recesses, and a plurality of interconnections for connecting the solder plugs and the external pads of the semiconductor chip, and a molded member which seals the semiconductor chip and the substrate.

Solder plugs filled in the recesses formed on backside of the substrate are used as constituting electrodes for mounting. Such substrate makes it possible to bond the semiconductor device to the printed interconnection board only with the gap corresponding to the thickness of the solder paste in mounting. The total thickness is lowered by the thickness of conventional solder balls arranged on the back surface of the substrate, as a result a semiconductor device having remarkably decreased thickness can be obtained.

The substrate of the semiconductor device preferably has means for effecting the solder paste to go into the recess formed on the second side of the substrate when mounting on a printed interconnection board.

By employing such a semiconductor device, the gap between the semiconductor device and the printed interconnection board can be eliminated, and the thickness in mounting is further reduced.

The means for effecting of the semiconductor device preferably are a trench formed on the surface of the solder plug which is to lead the molten solder paste to go into the recesses before the solder plug is melted in heating process.

The trench leads the molten solder paste into the recess through capillary phenomenon before the solder plug is melted, resulting in obtaining a semiconductor device of which bonding strength is large.

Thus the trench leads the molten solder paste into the recess in reliable manner, there is then provided a semiconductor device having ultimately small thickness in mounting as well as being much more strongly bonded.

BRIEF DESCRIPTION OF THE DRAWINGS

In the attached drawings.

DESCRIPTION OF THE PREFERRED EMBODIMENTS

Figure 1:
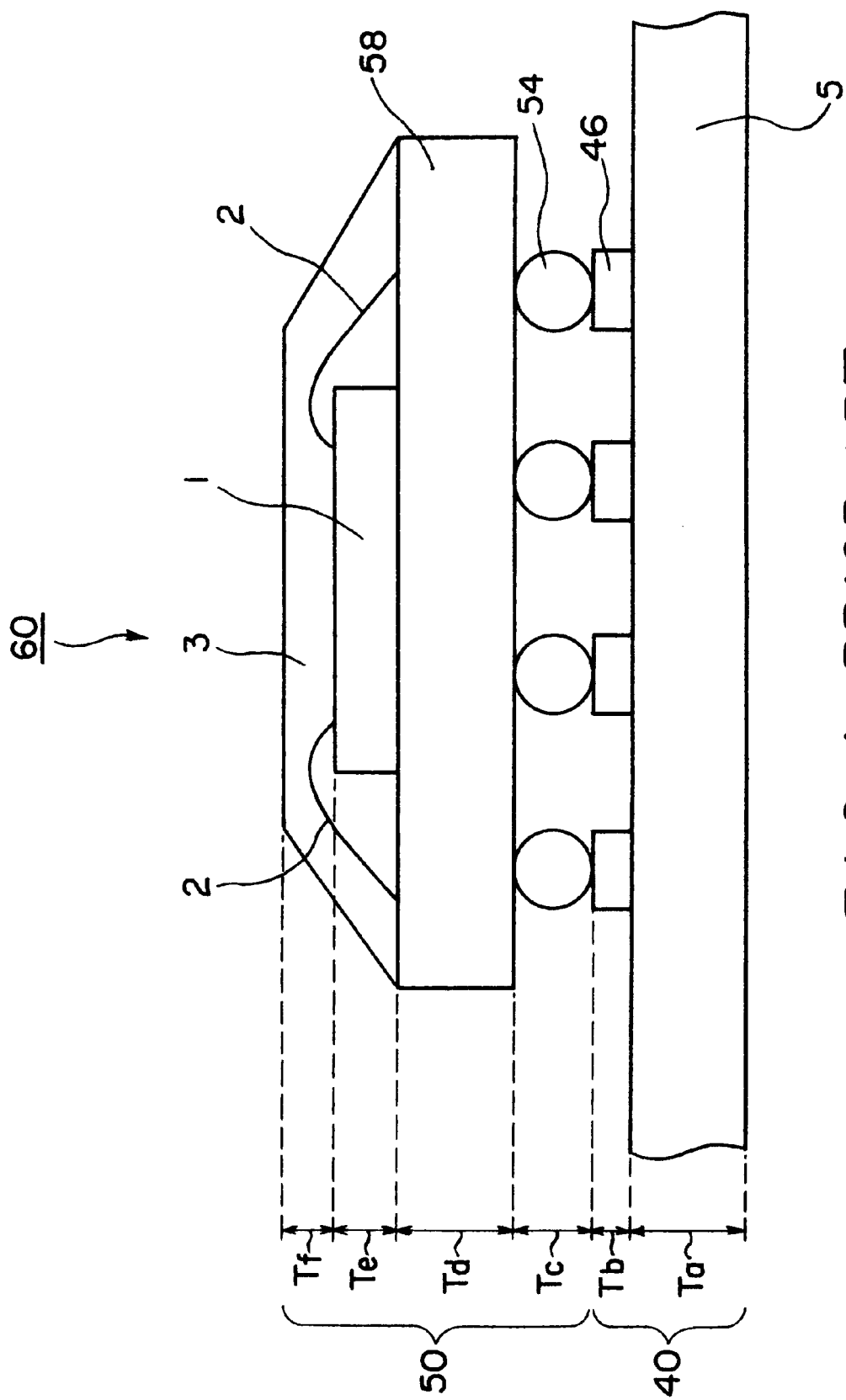
FIG. 1 shows an elevation view of a printed circuit board having an example of the BGA package in prior art.

Preferred embodiments of the invention will be explained by referring to attached drawings. In the drawings, parts same as those of the semiconductor device shown in FIG. 1 are referred by the same reference numerals and the explanations thereof will be omitted.

Figure 2:
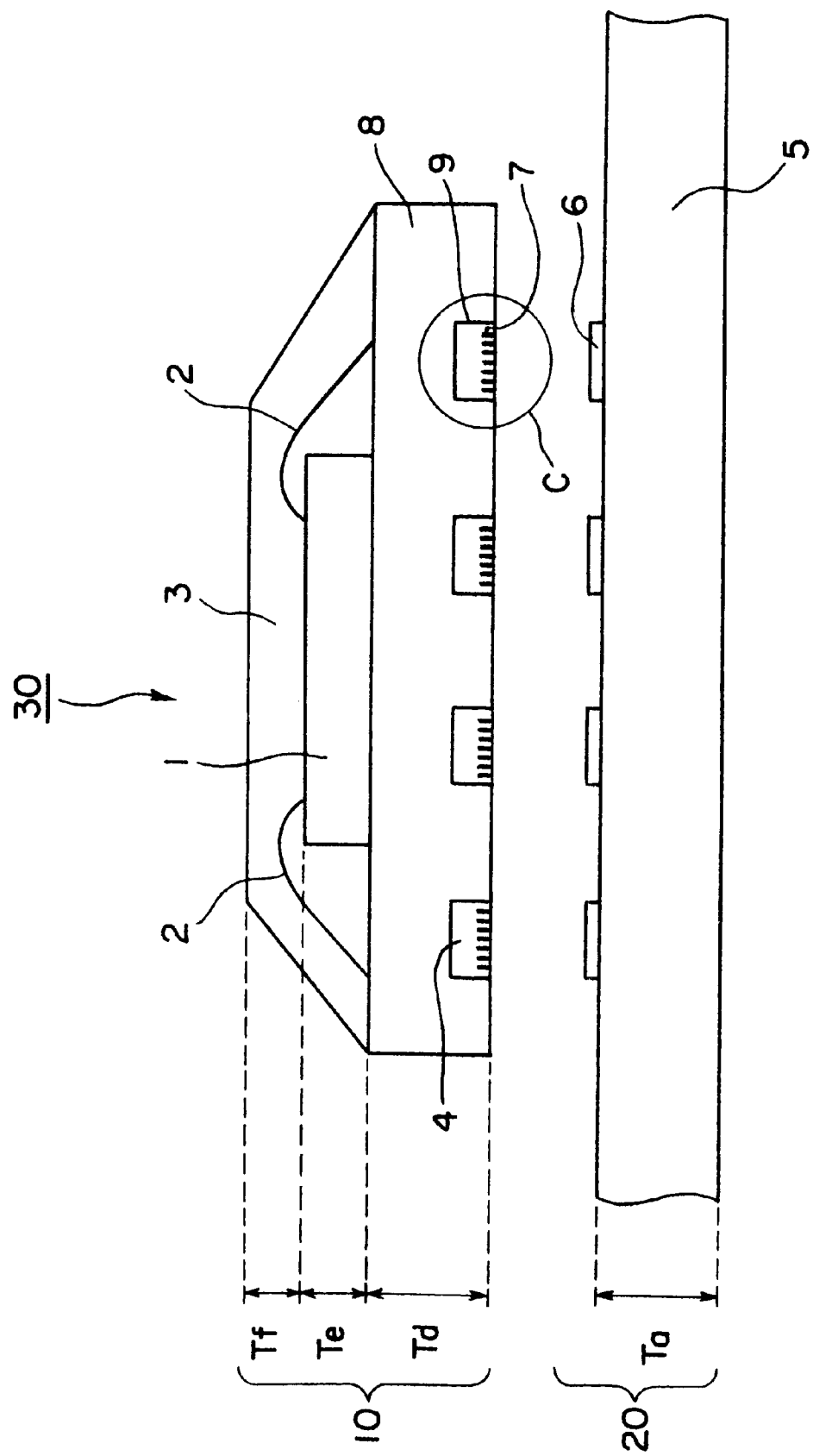
FIG. 2 shows a sectional view of a printed circuit board including an embodiment of a semiconductor device according to the invention.

As shown in FIG. 2, the invention is characterized in the structure of electrode pads formed on the substrate 8 of the package 10.

FIG. 2 shows a sectional view of a printed circuit board including an embodiment of a semiconductor device according to the invention. The printed interconnection board 20 is substantially the same as that shown in FIG. 1.

The semiconductor device 10 has a semiconductor chip 1 mounted on a principal surface of the package in approximate center thereof similar to the semiconductor device package 50 shown in FIG. 1, and includes a substrate 8 made from e.g. ceramic. In the peripheral portion of the principal surface of the substrate 8, a lead wire is formed (not shown) and connected through a bonding wire 2 to external electrode pads formed on the principal surface of the semiconductor chip 1.

On the backside of the substrate 8, recesses 9 are formed from the back surface of the substrate toward the principal surface thereof and in matrix form having rows and columns with predetermined intervals. The recess 9 has a width of approximate 450 to approximate 800 $\mu$m and a depth of approximate 300 to approximate 350 $\mu$m. In FIG. 2, the recess 9 has the width of 450 $\mu$m and the depth of 300 $\mu$m. In the recess 9, solder is filled so that solder plugs 4 are formed. These solder plugs 4 are connected to lead interconnections on the principal surface of the substrate 8 via through holes (not shown) formed through the substrate.

A plurality of deep and narrow trenches 7 are formed from the back surface part of each of solder plugs 4 filled in the recess 9, that is, in the vicinity of the back surface of the substrate 8, and toward the principal surface of the substrate 8.

On the principal surface of the printed interconnection board 20, solder paste 6 is printed corresponding to the arrangement of the recesses 9. The solder paste 6 is printed with a thickness which is selected such that its volume corresponding to trench portion is made substantially the same volume of the substrate 8. Other constitution of the printed interconnection board 20 is the same as the printed interconnection board 40.

The form of the trench 7 will now be explained referring to FIG. 3 and FIG. 4.

Figure 3:
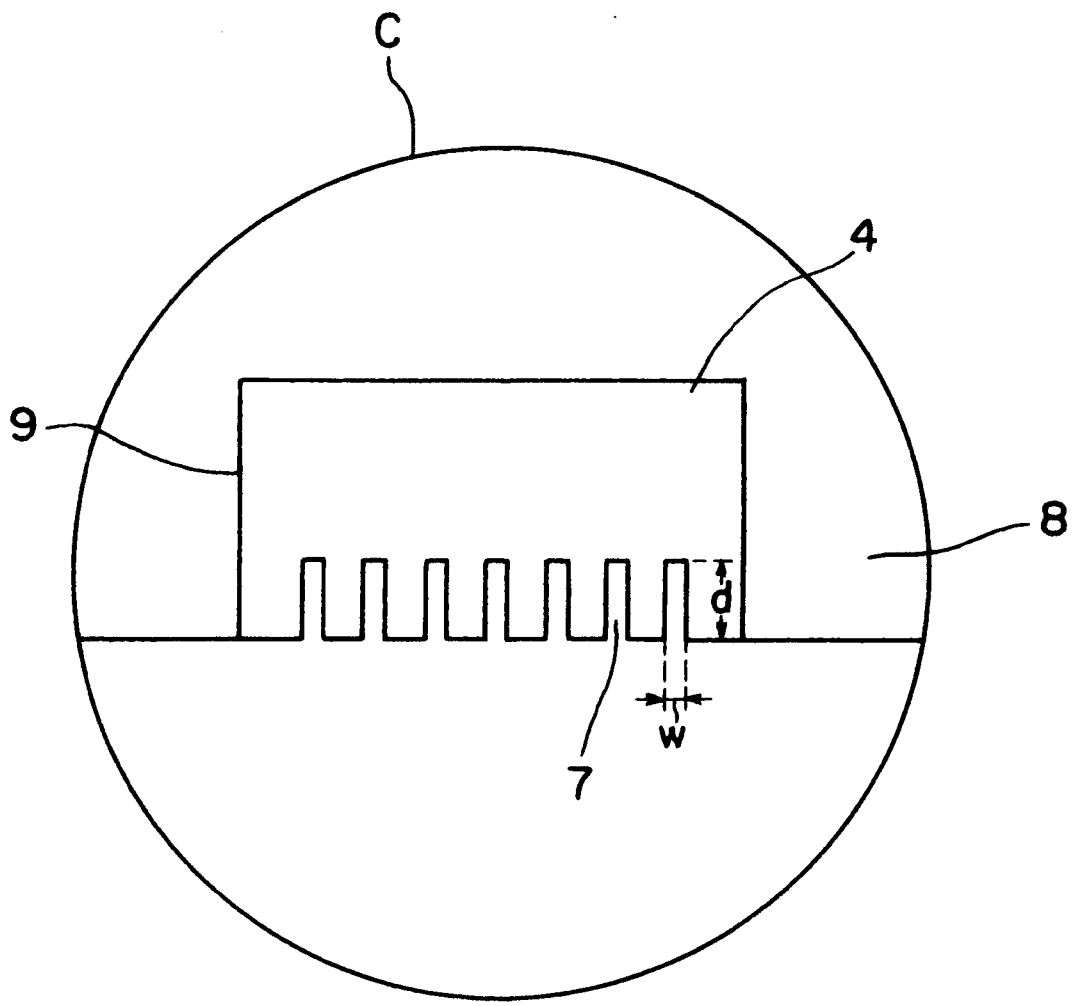
FIG. 3 shows an enlarged view of a portion marked by a circle C of the semiconductor device shown in FIG. 2.

FIG. 3 shows an enlarged view of a portion marked by a circle C of the semiconductor device shown in FIG. 2. As shown in FIG. 3, the trenches 7 are made on the surface part of the solder plug 4 formed in the recesses 9, and in section view of FIG. 3, seven trenches 7 are made in this embodiment. The trenches 7 are made so that each trench 7 has a width w, for example 30 $\mu$m, and a depth d, for example 60 $\mu$m, and an aspect ratio (d/w) is equal to 1 or more, for example 2, in this embodiment. Trenches 7 have not to be necessarily made in multiple but also one trench 7 like bar shape may be made.

Figure 4:
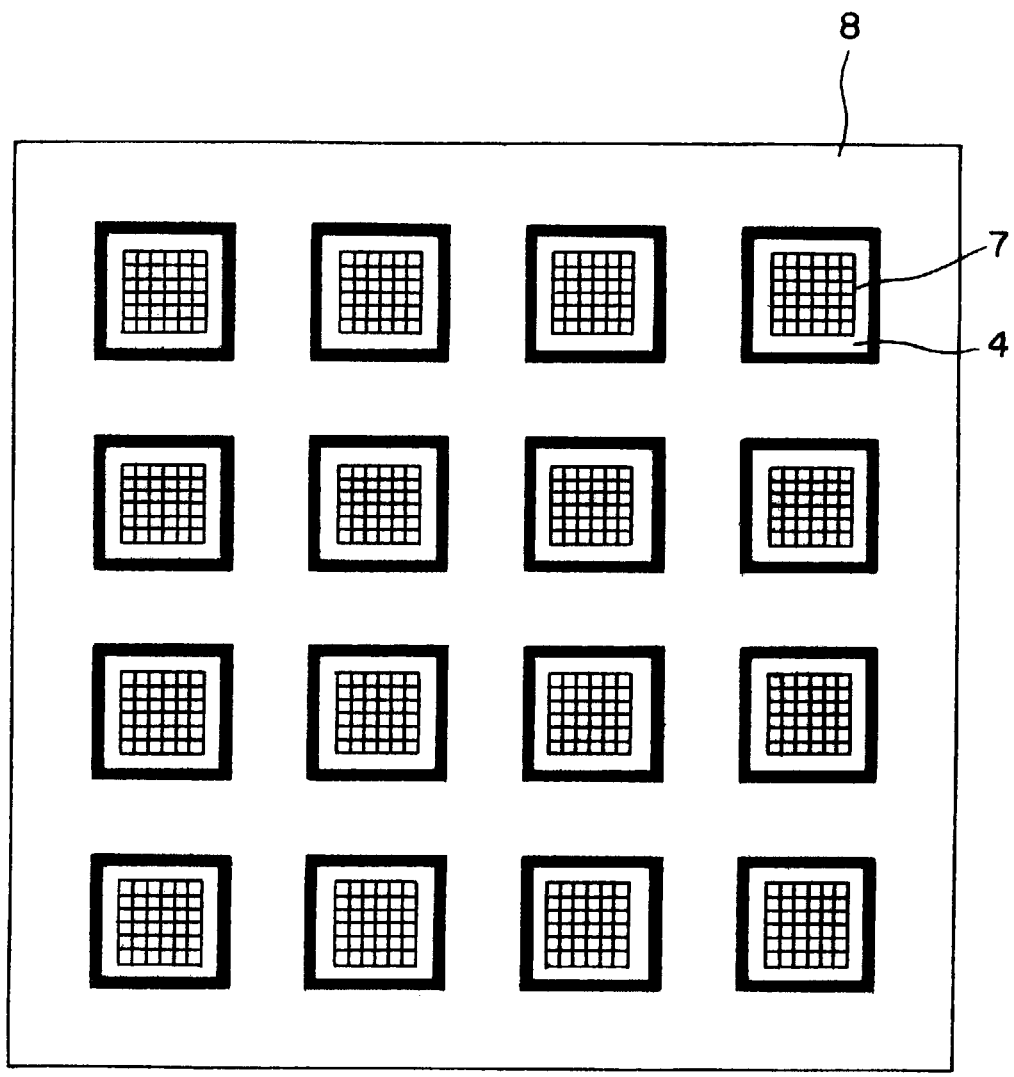
FIG. 4 shows a bottom plan view of the semiconductor device shown in FIG. 2.

FIG. 4 shows a bottom plan view of the semiconductor device shown in FIG. 2. As shown in FIG. 4, trenches 7 are made in orthogonal array in X direction by 7 and in Y direction by 7 with determined interval respectively, as if to form a lattice on the surface of solders plugs 4 filled in the recesses 9. The trenches 7 are made for example by pressing with a mold tool made of refractory metal and having net-like hard protrusion arranged in correspondence to allocation of the recesses 9 in the process of filling the molten solder.

The function of solder plugs 4 filled in the recess 9 and trenches 7 made on the surface part of the solder plugs 4 will be explained referring to FIG. 5 and FIG. 6.

Figure 5:
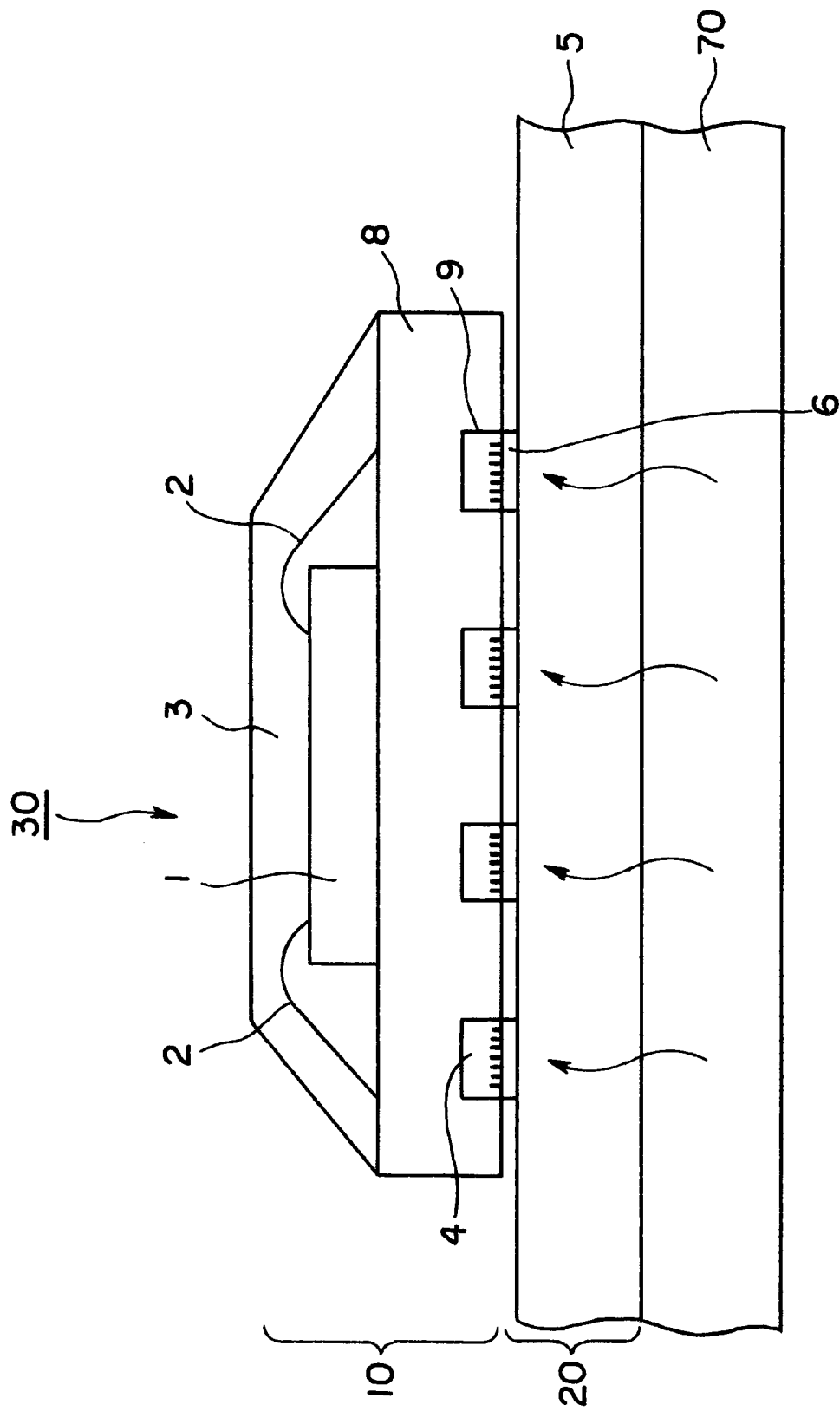
FIG. 5 shows a sectional view to explain the semiconductor device shown in FIG. 2.
Figure 6:
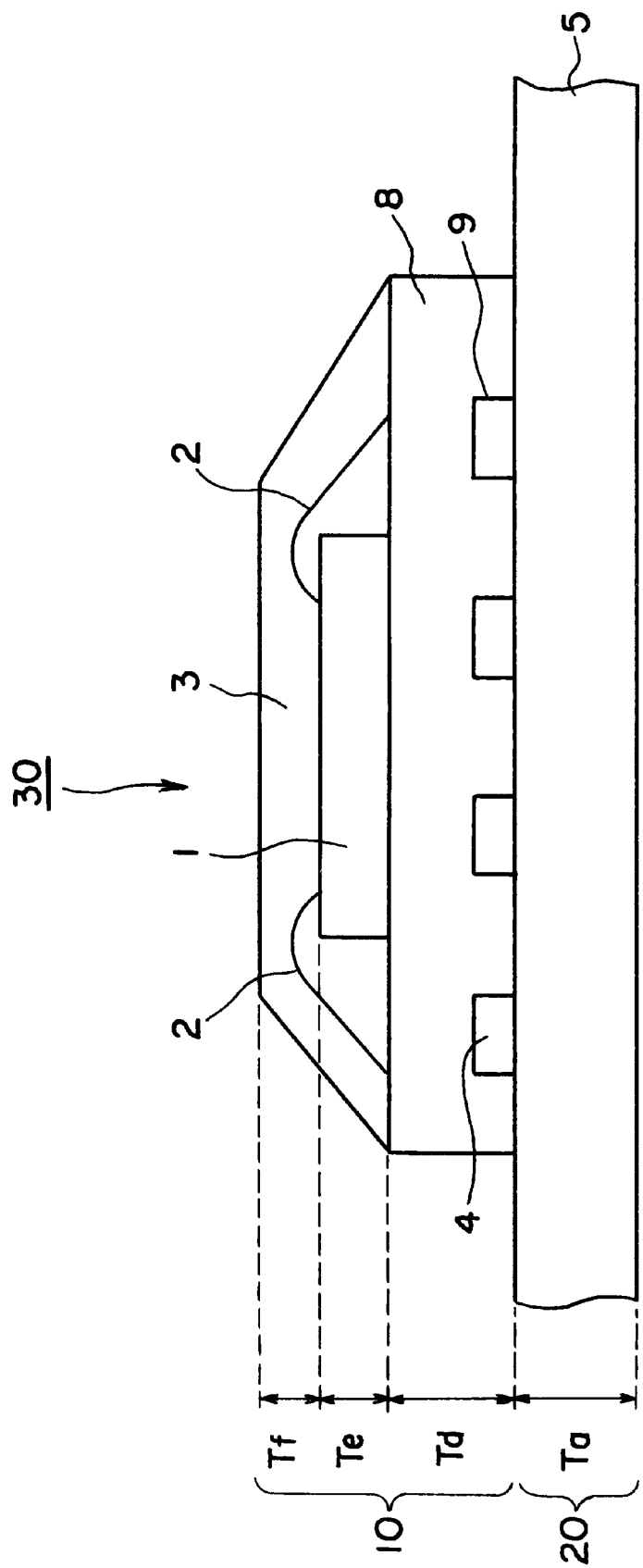
FIG. 6 shows a semiconductor device mounted on a printed circuit board according to the invention.

As shown in FIG. 5, the printed interconnection board 20 is set on a heater 70, then the semiconductor device package 10 is located on the printed interconnection board 20 so that the solder paste 6 corresponds to the solder plug 4. By heating the semiconductor device package 10 from the printed interconnection board 20 side using the heater 70, solder paste 6 melts and go into trenches 7 formed on the surface part of the solder plug 4 before the solder in the recesses 9 melts. Due to their large aspect ratio such as equal to 1 or more, capillary phenomenon is generated to cause the molten solder paste 6 to go deep into the trenches 7. After the great majority of the solder paste 6 are transferred into the recesses 9, the solder starts melting (reflow) to be connected to the wire (not-shown) formed on the area of the substrate 5 where the solder paste 6 is printed. After heating process being completed, solder 4 bonds to the wire on the printed circuit board 5 by such reflow process without any gap as shown in FIG. 6. The external electrodes of the semiconductor chip 1 are then connected to the wire on the printed circuit board 5 through bonding wire 2, through holes of the substrate 8 and solder plug 4. Furthermore, the solder paste 6 which is molten in the recesses 9 and solidified with the solder plug 4 and as a result, the semiconductor device package 10 are firmly fixed to the printed circuit board 5.

Consequently, total thickness Tall of the printed circuit board 30 which is thus formed has Ta (the thickness of the printed board 5), Td (the thickness of the substrate 8), Te (the thickness of the semiconductor chip 1), and Tf (the thickness of the resin 3 provided on the top of semiconductor chip 1), and is thinned by Tb (the thickness of the solder paste 46) and Tc (the thickness of the solder balls 54) in comparison with the prior art.

Since the semiconductor device 10 has solder plugs 4 filled in the recesses 9 formed from the back surface of the substrate 8 toward the principal surface thereof and the solder paste 6 of the printed interconnection board 20 is forwarded to go into the recesses 9 in melting, as mentioned above, the package 10 is firmly bonded to the printed circuit board 5 without any gap. Thus the printed circuit board 30 with small total thickness is provided.

Furthermore, trenches 7 made on the surface part of the solder 4 in the recesses 9 like a lattice in plane view enable the solder paste 6 of the printed interconnection board 20 to go deep into the recesses 9 in melting therefor capillary phenomenon. The bonding of solder is thus further strengthen, therefore the semiconductor device package 10 can be stably fixed to the printed board 5.

A preferred embodiment of the invention has been explained, however, the invention is not restricted by the embodiment and may be applied in various modes without departing from the scope. In the above embodiment, the trenches 7 are formed in a lattice in plane view, this shape does not limit the scope of the invention. As long as the aspect ratio of the trench 7 is large enough so that the molten solder 6 is forwarded to go deep into the recesses 9 capillary phenomenon, the trenches may be formed in other shapes, for example, in the bar shape in sectional view.

What is claimed is:

1. A semiconductor device comprising:
   a semiconductor chip having external pads,
   a substrate having a first surface and a second surface which is opposite to the first surface, the first surface supporting the semiconductor chip thereon, and a plurality of recesses formed in a matrix open on the second surface facing toward the first surface, said substrate further having:
      a plurality of solder plugs filled in the recesses, and
      a plurality of interconnections for connecting the solder plugs and the external pads of the semiconductor chip, and a molded member which seals the semiconductor chip and the substrate.
2. A semiconductor device according to claim 1, wherein the substrate has means for causing molten solder to go into the recess by capillary phenomenon when mounting on a printed interconnection board.
3. A semiconductor device according to claim 2, wherein the means for causing is a trench formed on the surface part of the solder plug which is to lead the molten solder to go into the recess before the solder plug is melted in heating process.
4. A semiconductor device according to claim 3, wherein the trench forms a lattice shape in plan view.
5. A semiconductor device according to claim 3, wherein the trench has the aspect ratio of about 1 or more.
6. A semiconductor device according to claim 4, wherein the trench has the aspect ratio of about 1 or more.
7. A semiconductor device according to claim 5, wherein the aspect ratio of the trench is about 2.
8. A semiconductor device according to claim 6, wherein the aspect ratio of the trench is about 2.
9. A semiconductor device according to claim 1, wherein a surface part of the solder plug is provided with a trench.
10. A semiconductor device according to claim 9, wherein the trench is sized to allow molten solder to flow into the recess by capillary phenomenon when mounting on a printed interconnection board.
11. A semiconductor device according to claim 9, wherein the trench forms a lattice shape in plan view.
12. A semiconductor device according to claim 9, wherein the trench has an aspect ratio of about 1 or more.
13. A semiconductor device according to claim 9, wherein the trench has an aspect ratio of about 2.

* * * * *